United States Patent [19]

Ito et al.

[11] Patent Number: 4,532,485

[45] Date of Patent: Jul. 30, 1985

[54] FINE ADJUSTING MECHANISM FOR PRESET TYPE TUNER

[75] Inventors: Katsuo Ito, Kanazawa; Kazunori Yoshimura, Ishikawa; Kazuhiro Tsuji; Kazuo Kontani, both of Kanazawa, all of Japan

[73] Assignee: Murata Manufacturing Co., Ltd., Japan

[21] Appl. No.: 560,760

[22] Filed: Dec. 12, 1983

[30] Foreign Application Priority Data

Dec. 17, 1982 [JP] Japan .................. 57-191730[U]

[51] Int. Cl.³ .............................................. H03J 5/28
[52] U.S. Cl. ...................................... 334/51; 74/10.8; 74/384; 334/57; 464/30
[58] Field of Search ............... 74/10.8, 10.85, 384; 334/51, 57, 58, 74

[56] References Cited

U.S. PATENT DOCUMENTS

| | | | |
|---|---|---|---|
| 3,248,674 | 4/1966 | Fulton | 334/51 |
| 4,123,781 | 10/1978 | Ito et al. | 334/74 X |
| 4,152,682 | 5/1979 | Ito et al. | 334/57 X |
| 4,311,056 | 1/1982 | Tanida | 334/57 X |
| 4,429,291 | 1/1984 | Tenjin | 334/51 |

Primary Examiner—Paul Gensler
Attorney, Agent, or Firm—Ostrolenk, Faber, Gerb & Soffen

[57] ABSTRACT

An improved fine adjusting mechanism for a preset type tuner, which is so arranged that, with a ring having cam portions being fitted under pressure onto a fine adjusting shaft of a tuner for simultaneous rotation with it and also for slippage with respect to the fine adjusting shaft against a torque larger than a predetermined extent, a lever having a transmission gear rotatably mounted on it is urged by a spring force so that its actuating projections are held in pressure contact with the cam surface of the ring with the cam portions, so that rotation of the fine adjusting shaft is converted into a pivotal movement of the lever through the ring so as to positively engage the transmission gear with each of gears having threaded portions for an efficient local oscillation frequency adjustment.

4 Claims, 14 Drawing Figures

FINE ADJUSTING MECHANISM FOR PRESET TYPE TUNER

BACKGROUND OF THE INVENTION

The present invention generally relates to an adjusting mechanism and more particularly, to a fine adjusting mechanism for a preset type tuner which employs a clutch system for use, for example, in a television receiver.

Figure 1:
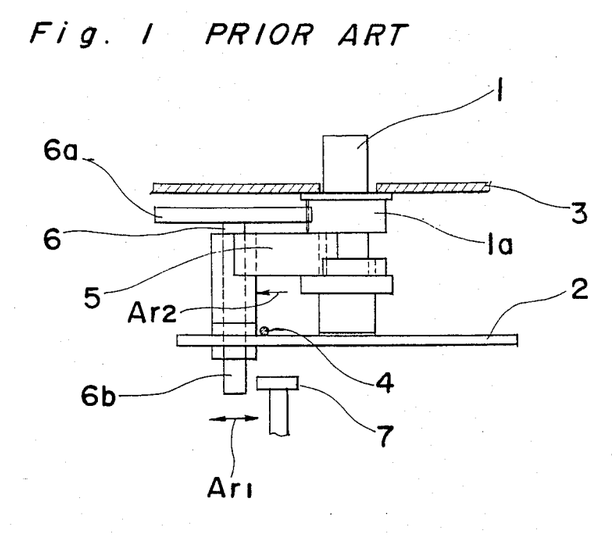
FIG. 1 is a fragmentary side elevational view, partly in section, showing a construction of a conventional fine adjusting mechanism for a clutch type tuner (already referred to)
Figure 2A:
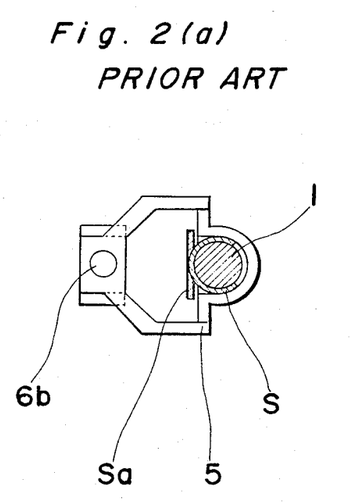
FIGS. 2(a) and 2(b) are fragmentary top plan views, partly in section, of the fine adjusting mechanism of FIG. 1 for explaining the functionings thereof (already referred to)

Conventionally, as a fine adjusting mechanism for a preset type tuner of the above described kind, there has been proposed, for example, an arrangement as shown in FIG. 1, which includes a fine adjusting shaft 1 rotatably supported by a tuner frame 2. A transmission gear 6 is rotatably mounted on a slider 5 and urged by a spring 4 in the direction indicated by an arrow Ar2 so as to be spaced from the fine adjusting shaft 1. A coil spring S is fitted, using its spring force, onto the shaft 1 at a position where the slider 5 is externally fitted over the shaft 1 as is most clearly shown in FIG. 2(a). The slider 5 and the transmission gear 6 are mounted to be slidable between the tuner frame 2 and a front plate 3 thereof back and forth in the directions indicated by arrows Ar1. Accordingly, the slider 5 and the transmission gear 6 are slidable in a direction which is perpendicular to the axial direction of the shaft 1.

Figure 2B:
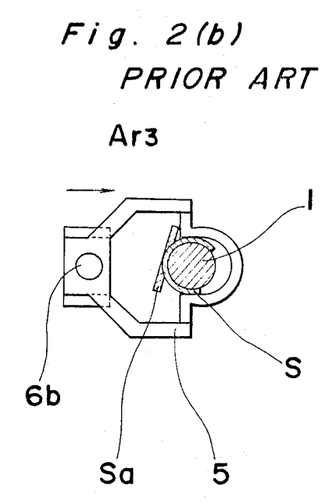

Upon rotation of the fine adjusting shaft 1, the coil spring S rotates simultaneously with the fine adjusting shaft 1 as shown in FIG. 2(b), and a biasing member Sa provided on the coil spring S displaces the slider 5 in a direction of an arrow Ar3 so as to bring gears 6a and 6b provided at opposite ends of the transmission gear 6 into engagement with a gear 1a a of the fine adjusting shaft 1 and a gear 7 having a threaded portion for local oscillation frequency adjustment.

Figure 3:
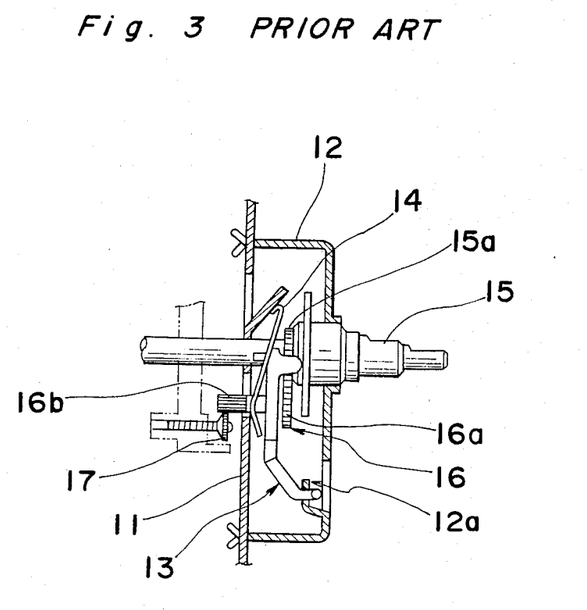
FIG. 3 is a fragmentary side sectional view of another conventional fine adjusting mechanism for a push type tuner (already referred to)

Incidentally, for the fine adjusting mechanism of the preset type tuner, there has also been employed, besides the clutch system as described so far, a push system mechanism as shown in FIG. 3, which is so arranged that, by pivotally supporting a lever 13 at a support portion 12a provided on a front frame 12 of a tuner frame 11, the lever 13 is urged, by a spring force of a spring 14, in a direction opposite to the direction for depressing a fine adjusting shaft 15 into the front frame 12, so that, upon depression of said shaft 15 into the front frame 12, the lever 13 is pivoted so as to bring gears 16a and 16b of a transmission gear 16 rotatably mounted on said lever 13, into engagement with a gear 15a provided on the fine adjusting shaft 15 and a gear 17 having a threaded portion respectively.

As is clear from a comparison between the fine adjusting mechanism of the preset type tuner employing the clutch system in FIG. 1 and that of the tuner of the push system in FIG. 3, there are only few parts which can be commonly used therebetween, and if it is intended to manufacture the push type tuner together with the clutch type tuner, the number of parts exclusive for each type of the tuners is undesirably increased.

Moreover, in the fine adjusting mechanism for the preset type tuner of FIG. 1, the acting point of the biasing member Sa of the coil spring S with respect to the slider 5 is limited to one point, and thus, an undue force tends to be applied to the slider 5, coil spring S, etc., while it is necessary to provide a large opening (not particularly shown) in the tuner frame 2 for ensuring positive sliding and assembling of the slider 5, thus inviting such a problem that an unnecessary radiation through said opening is undesirably increased.

SUMMARY OF THE INVENTION

Accordingly, an essential object of the present invention is to provide an improved fine adjusting mechanism for a preset type tuner, which is so arranged that, with a ring having cam portions being fitted under pressure onto a fine adjusting shaft of a tuner for simultaneous rotation therewith, and also for slippage with respect to the fine adjusting shaft against a torque larger than a predetermined extent, a lever having a transmission gear rotatably mounted thereon is urged by a spring force so that its actuating projections are held in pressure contact with the cam surface of the ring with the cam portions, whereby rotation of the fine adjusting shaft is converted into a pivotal movement of the lever through the ring having the cam portions so as to engage the transmission gear with gears having threaded portions for common use of its parts with those of a fine tuning mechanism of a push type tuner except for the ring with the cam portions, while unnecessary radiation is adapted to be reduced, with a simultaneous stabilization of functions of the mechanism.

Another important object of the present invention is to provide a fine adjusting mechanism of the above described type, which is simple in construction and highly reliable, and can be readily manufactured at low cost.

In accomplishing these and other objects, according to one preferred embodiment of the present invention, there is provided a fine adjusting mechanism for a preset type tuner which employs a clutch mechanism arranged to rotate a fine adjusting shaft for transmitting the rotation thereof to gears having threaded portions for local oscillation frequency adjustment each provided on a preset plate. The fine adjusting mechanism comprises a lever pivotally supported by a support portion provided on a tuner frame and the like, a transmission gear having a first gear engageable with a gear provided on the fine adjusting shaft and a second gear engageable with each of said gears having threaded portions, and rotatably mounted on said lever, a drum portion coaxially provided at the end of said fine adjusting shaft at the side of the tuner frame, a ring having cam portions formed by cutting a peripheral edge of a cylinder at its one open end into approximately a triangular shape towards the other open end of the cylinder to provide the cam portions, and fitted under pressure onto said drum portion so as to be rotatable together with said fine adjusting shaft, and also to be slipped with respect to said drum portion against a torque higher than a predetermined degree, actuating projections formed on said lever and adapted to contact under pressure the cam surface of the cam portions of said ring by spring force acting on said lever, whereby the rotation of said fine adjusting shaft is converted into the pivotal movement of the lever through said ring having the cam portions, with the first and second gears of said transmission gear being respectively adapted to engage the gear of the fine adjusting shaft and each of the gears with the threaded portions.

By the arrangement according to the present invention as described above, an improved fine adjusting mechanism for a preset type tuner has been advantageously presented.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

Figure 4:
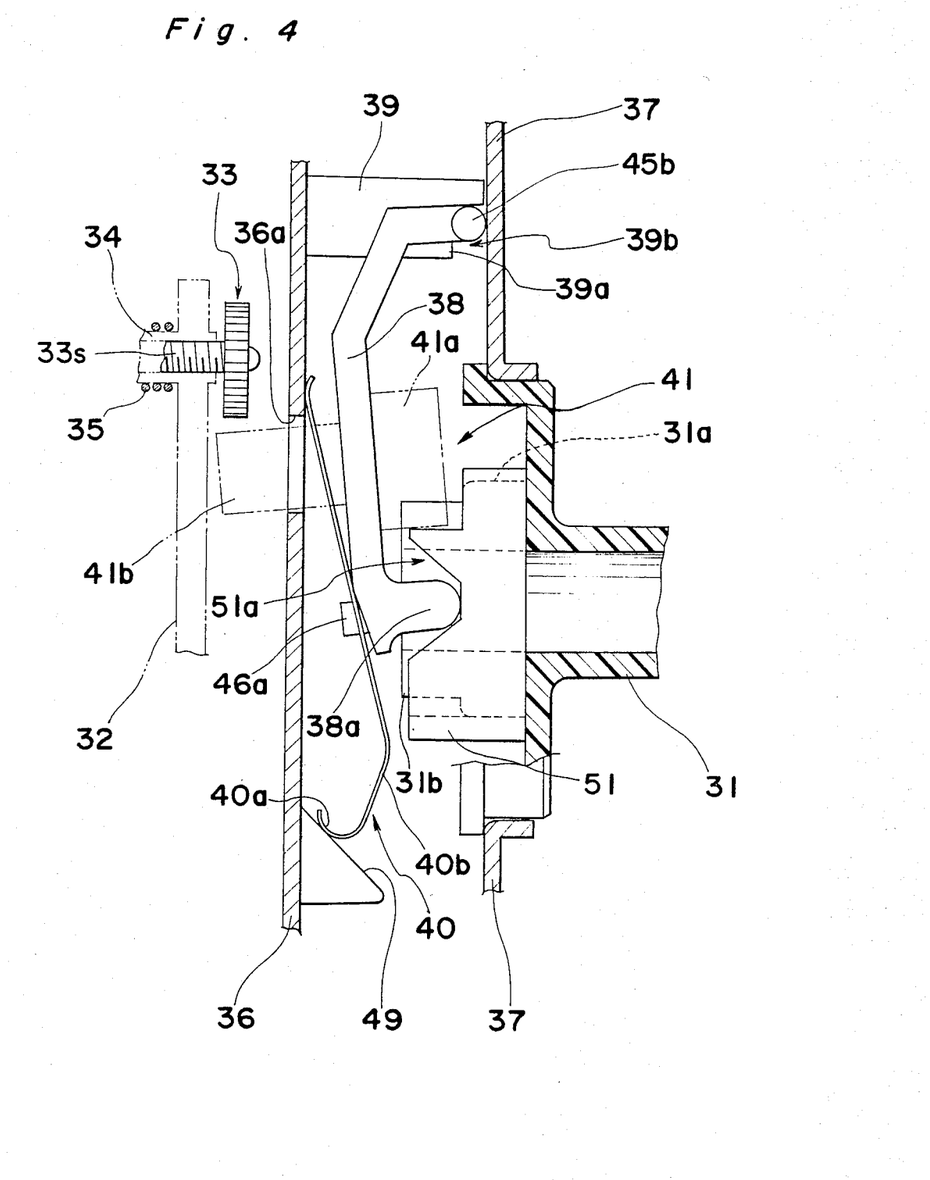
FIG. 4 is a side sectional view of a fine adjusting mechanism for a clutch type tuner according to one preferred embodiment of the present invention.

Referring now to the drawings, there is shown in FIG. 4 an improved fine adjusting mechanism for a preset type tuner employing a clutch system according to one preferred embodiment of the present invention, which includes a fine adjusting shaft 31 externally fitted onto a main shaft (not particularly shown), a preset plate 32 fixed to said main shaft and gears 33 with threaded portions 33s for local oscillation frequency adjustment, each arranged on the preset plate 32 in a concentric relation with respect to the main shaft so as to correspond to the number of channels, for example, of a television receiver. The threaded portion 33s of each of the gears 33 is engaged with a hollow portion of a coil 35 wound on a bobbin 34 so as to preset the best images through fine adjustment of inductance of the coil 35 by altering the degree of threading or insertion of the threaded portion 33s into said hollow portion in a known manner.

The fine adjusting mechanism of FIG. 4 also includes a tuner frame 36, a front plate 37 for said tuner frame 36, a support portion 39 extending from a front face of the tuner frame 36 towards the front plate 37, a lever 38 pivotally connected at its one end to the support portion 39, and a plate spring 40 disposed between the lever 38 and the tuner frame 36 so as to urge the projection 38a of lever 38 into sliding contact with cam at its projections 38a formed at the other end thereof, cam portions 51a of a ring 51 provided on the fine adjusting shaft 31 and described in more detail later.

In the fine adjusting mechanism of FIG. 4, there is further provided a transmission gear 41 rotatably mounted on the lever 38 for transmitting rotation of the fine adjusting shaft 31 to each of the gears 33 having the threaded portions 33s, and having a first gear 41a of a larger diameter which engages a gear 31b formed on said fine adjusting shaft 31 and a second gear 41b of a smaller diameter which loosely extends through an opening 36a formed in the tuner frame 36 so as to confront the gear 33 with the threaded portion 33s at its end portion.

Figure 5A:
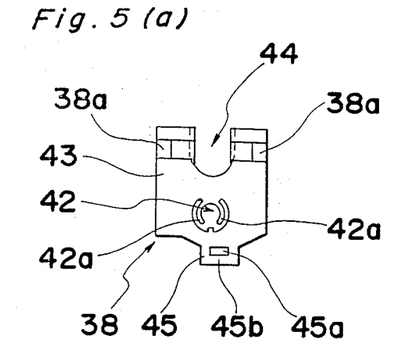
FIGS. 5(a), 5(b) and 5(c) are respectively a top plan view, a front elevational view, and a side elevational view of a lever employed in the arrangement of FIG. 4.
Figure 5B:
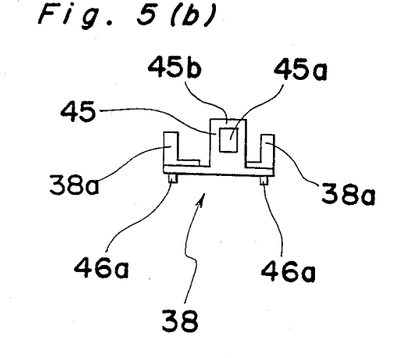
Figure 5C:
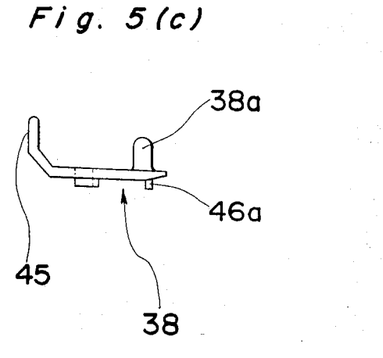
Figure 5D:
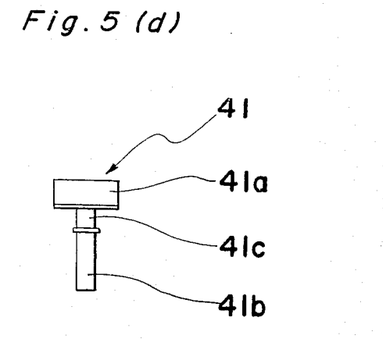
FIG. 5(d) is a side elevational view of a transmission gear also employed in the arrangement of FIG. 4.

As shown in FIGS. 5(a), 5(b) and 5(c), the lever 38 is provided with a rectangular plate-like bearing portion 43 having a bearing 42 including a pair of support pieces 42a between which a groove 41c (FIG. 5(d)) of the transmission gear 41 is inserted so that the gear 41 may be rotatably supported thereat. Moreover, at one end in the longitudinal direction of the bearing portion 43 of said lever 38, there is provided a notch 44 formed into a semi-circular shape at its forward end for receiving therein the main shaft (not shown), while a long and thin strip 45 having a rectangular opening 45a formed therein is provided at the other end of the bearing portion 43. The strip 45 is folded at two stages so that the bearing portion 43 of the lever 38 becomes generally parallel with respect to the tuner frame 36 upon pivotal movement of said lever 38.

The portion of the lever 38 between the forward end of the strip 45 and the opening 45a is formed into a circular cross section to provide a support shaft 45b (FIG. 4) of the lever 38, while the portions thereof at the opposite sides of the notch 44 are formed into a semi-circular cross section at the forward ends to provide the actuating projections 38a. On the surface of the bearing portion 43 opposite to its surface provided with said projections 38a, cylindrical stoppers 46a are provided so as to be slightly inclined towards the forward end of the lever 38 (FIGS. 5(b) and 5(c)).

As shown in FIG. 4, the lever 38 having the construction as described above is pivotally supported at the support portion 39 extending from the tuner frame 36 by fitting the support shaft 45b of the lever 38 into a recess 39b defined between a notch 39a at the forward end of the support portion 39 and the front plate 37.

Figure 6:
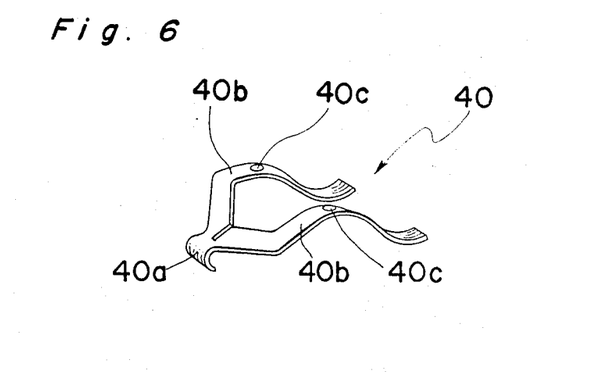
FIG. 6 is a perspective view of a plate spring employed in the arrangement of FIG. 4, FIGS. 7(a) and 7(b) are a top plan view and a side elevational view of a ring having cam portions employed in the arrangement of FIG. 4.

On the other hand, as shown in FIG. 6, the plate spring 40 includes a pair of curved spring portions 40b branched from a combined end 40a and each having a predetermined width. At generally central portions of the spring portions 40b, circular holes 40c each having a diameter slightly larger than that of the stoppers 46a are formed.

In FIG. 4, the plate spring 40 has the stoppers 46a of the lever 38 fitted into the circular holes 40c provided in the pair of spring portions 40b thereof, while the combined end 40a and the end portions of the spring portions 40b of the plate spring 40 are suitably curved to have proper radius of curvatures for contact with an inclined face 49 of the tuner frame 36 and a corresponding face of said tuner frame respectively.

Accordingly, the plate spring 40 is prevented from any slippage by the stoppers 46a of the lever 38, while a component force of the plate spring 40 produced by the inclined face 49 of the tuner frame 36 urges the lever 38 towards the notch 39a of the support portion 39 for a positive journalling of said lever 38.

Figure 7A:
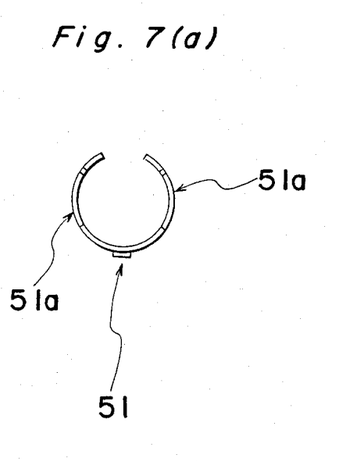
Figure 7B:
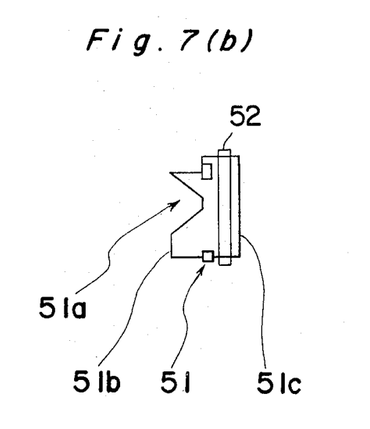
Figure 7C:
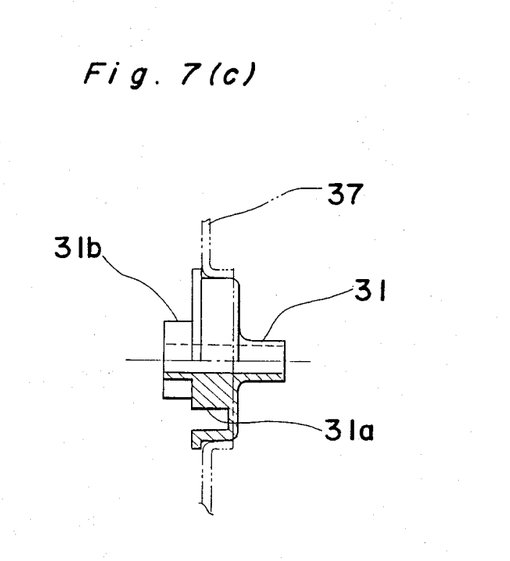
FIG. 7(c) is a fragmentary side elevational view, partly in section, of a fine adjusting shaft employed in the arrangement of FIG. 4.

Subsequently, as shown in FIGS. 7(a) and 7(b), the ring 51 having the cam portions 51a which the actuating projections 38a of the lever 38 contact under pressure, is made of a resilient metallic material formed generally into a cylindrical shape, and cut, in its peripheral edge at one open end 51b thereof, into an approximately triangular shape towards its other open end 51c, for example, at two places so as to provide the cam portions 51a as shown. The above ring 51 with the cam portions 51a is fitted under pressure, by its spring force, onto a drum portion 31a (FIG. 7(c)) coaxially provided at the end portion of the fine adjusting shaft 31 in such a manner as to be rotated simultaneously therewith, and also to be slidable with respect to said drum portion 31a against a torque larger than a predetermined degree, and thus, the ring 51 with the cam portions 51a and the drum portion 31a constitute the clutch mechanism in the fine adjusting mechanism of the tuner in FIG. 4. If desired, the ring 51 may be fitted with a coil spring 52, shown schematically in FIG. 7(b), to provide additional spring force thereto.

By the above arrangement for the fine adjusting mechanism of the tuner, upon rotation of the fine adjusting shaft 31, the ring 51 with the cam portions 51a rotates simultaneously with the above fine adjusting shaft 31.

Figure 8:
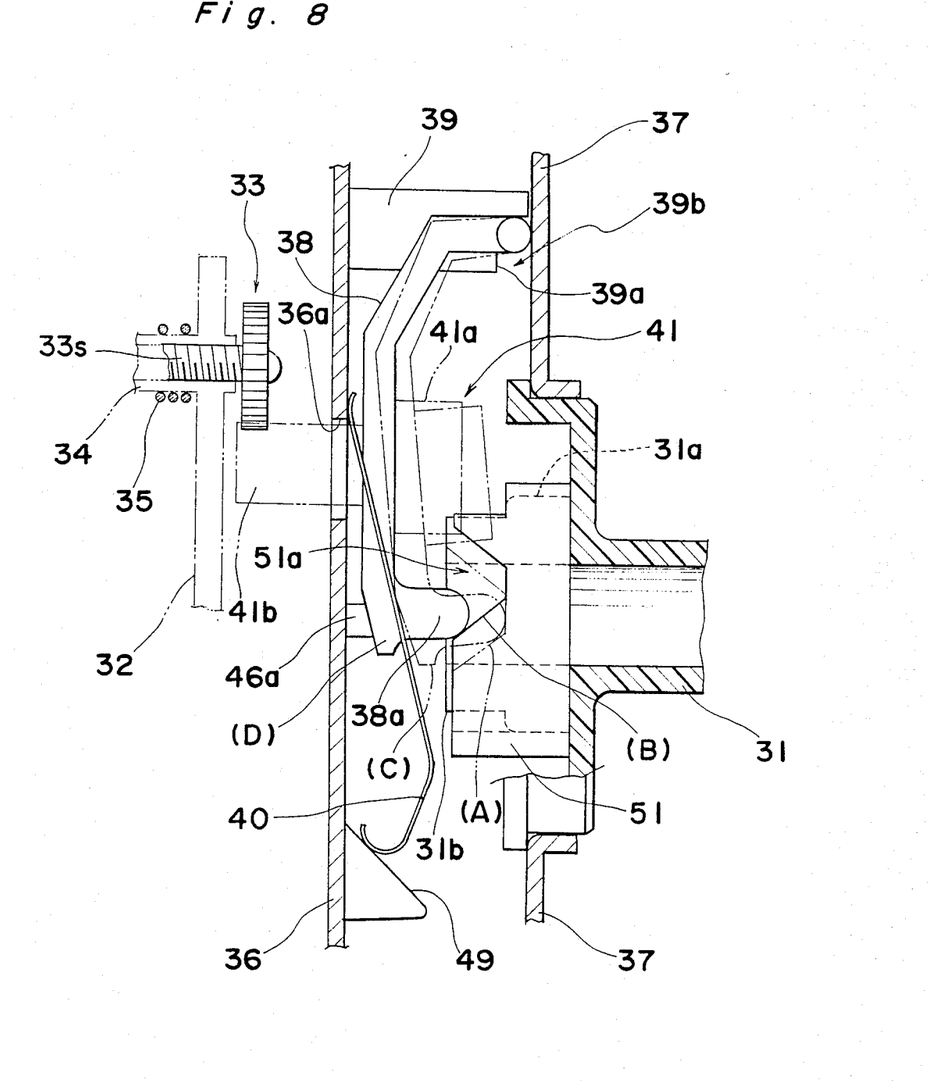
FIG. 8 is a view similar to FIG. 4, which particularly explains the functionings of the arrangement of FIG. 4.

In the above case, when the cam portions 51a of the ring 51 are rotated from a position (A) to a position (B) in FIG. 8 by the rotation of the fine adjusting shaft 31, said cam portions 51a urge the actuating projections 38a of the lever 38 towards the tuner frame 36, and cause the lever 38 to pivot against the spring force of the plate spring 40, from a position (C) up to a position (D) in FIG. 8 where the stoppers 46a of the lever 38 contact the tuner frame 36.

At the position (D) in FIG. 8, the first gear 41a of the transmission gear 41 is engaged with the gear 31b of the fine adjusting shaft 31, while the second gear 41b thereof is in mesh with the gear 33 having the threaded portion.

Under the above state, upon further rotation of the fine adjusting shaft 31, the ring 51 with the cam portions 51a slips over the drum portion 31a of the fine adjusting shaft 31, and the rotation of said fine adjusting shaft 31 is transmitted to the gear 33 with the threaded portion, through the transmission gear 41 so as to alter the amount of threading-in of the gear 33 for variation of coil inductance.

As is seen from the foregoing description, in the embodiment of the present invention as explained so far, it is so arranged that the rotation of the fine adjusting shaft 31 is converted into the pivotal movement of the lever 38 through the ring with the cam portions so as to engage the transmission gear 41 with the gear 33 having the threaded portion, and thus, the parts thereof may be generally commonly used with those of the fine adjusting mechanism of the push type tuner described earlier with reference to FIG. 3 except for the ring 51 with the cam portions 51a. Moreover, since the lever 38 receives the rocking force from the ring 51 with the cam portions, through the two actuating projections 38a thereof, no undue force is applied to the lever 38 to achieve a smooth pivotal movement thereof.

Furthermore, the opening 36a of the tuner frame 36 for loosely fitting the transmission gear 41 therethrough may be small in size, with a consequent reduction of unnecessary radiation from the interior of the tuner frame 36.

In the foregoing embodiment, the ring 51 with the cam portions described as prepared by the metallic material may be formed by a resinous material. In this case, if the spring force of such a ring is not sufficient, a ring or coil spring (not shown) may further be fitted around the peripheral portion of the ring made of the resinous material.

It should be noted here that, in the foregoing embodiment, although the fine adjusting mechanism which employs the plate spring 40 as a means for urging the lever 38 has been mainly described, such plate spring 40 may be replaced by various other springs such as coil springs, torsion springs, etc. which can be mounted in various other places depending on the characteristics thereof. With respect to the lever 38 also, the support portion 39 thereof may be replaced by a support portion provided, for example, on the front plate 37 of the tuner frame 36.

As is clear from the foregoing description, in the fine adjusting mechanism according to the present invention, since it is so arranged that the rotation of the fine adjusting shaft is converted into the pivotal movement of the lever through the ring having the cam portions and fitted over the drum portion of said fine adjusting ring so as to be slippable, with the transmission gear which is rotatably provided on said lever being adapted to be engaged with the gears having the threaded portions for local oscillation frequency adjustment, most of the parts may be commonly used with those of the fine adjusting mechanism of the push type tuner, except for the ring with the cam portions, and thus, in the case where the tuners of the push type and clutch type are to be simultaneously produced, manufacturing cost of the tuners may be markedly reduced through the simplification in the constructions.

Moreover, the lever rotatably supporting the transmission gear is provided with the plurality of actuating projections to receive the rocking force from the ring with the cam portions for the smooth pivotal movement thereof, and thus, the rotation of the fine adjusting shaft may be positively transmitted to the gears with the threaded portions for an efficient local oscillation frequency adjustment.

Furthermore, the opening of the tuner frame for loosely fitting the transmission gear therein may be small in size so as to allow the transmission gear to move together with the lever during the pivotal movement, with a consequent reduction of the unnecessary radiation from the interior of the tuner frame through such opening.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. In a preset type tuner which employs a clutch mechanism arranged to rotate a fine adjusting shaft for transmitting the rotation thereof to gears having threaded portions for local oscillation frequency adjustment each provided on a preset plate, a fine adjusting mechanism which comprises a lever pivotally supported by a support portion provided on a tuner frame and the like, a transmission gear having a first gear engageable with a gear provided on the fine adjusting shaft and a second gear engageable with each of said gears having threaded portions, and rotatably mounted on said lever, a drum portion coaxially provided at the end of said fine adjusting shaft at the side of the tuner frame, a ring having cam portions formed by cutting a peripheral edge of a cylinder at its one open end into approximately a triangular shape towards the other open end of the cylinder to provide the cam portions, and fitted under pressure onto said drum portion so as to be rotatable together with said fine adjusting shaft, and also to be slipped with respect to said drum portion against a torque higher than a predetermined degree, actuating projections formed on said lever and adapted to contact under pressure the cam surface of the cam portions of said ring by spring force acting on said lever, whereby the rotation of said fine adjusting shaft is converted into the pivotal movement of the lever through said ring having the cam portions, with the first and second gears of said transmission gear being respectively adapted to engage the gear of the fine adjusting shaft and each of the gears with the threaded portions.

2. A fine adjusting mechanism as claimed in claim 1, wherein said second gear of said transmission gear is loosely extended through a small opening formed in the tuner frame so as to be engageable with each of the gears with the threaded portions for reduction of unnecessary radiation from an interior of the tuner frame.

3. A fine adjusting mechanism as claimed in claim 1, wherein said ring having the cam portions is made of a metallic material.

4. A fine adjusting mechanism as claimed in claim 1, wherein said ring having the cam portions is made of a resinous material and further including a coil spring fitted around said ring to provide a sufficient spring force.

* * * * *